United States Patent
Chang

(10) Patent No.: US 6,439,460 B1
(45) Date of Patent: Aug. 27, 2002

(54) INSTANT SYNCHRONOUS AUTOMATIC GAIN CONTROL APPARATUS

(76) Inventor: Yu-Chun Chang, 4F, No. 225, Chin-Lung Rd., Nei-Hu Dist., Taipei (TW)

(*) Notice: Subject to any disclaimer, the term of this patent is extended or adjusted under 35 U.S.C. 154(b) by 108 days.

(21) Appl. No.: 09/736,262

(22) Filed: Dec. 15, 2000

(51) Int. Cl.[7] ................................................ G06K 7/10
(52) U.S. Cl. .............................. 235/462.26; 235/462.25
(58) Field of Search .................... 235/462.26, 462.25, 235/462.01, 462.27, 462.28, 462.29, 454

(56) References Cited

U.S. PATENT DOCUMENTS

| | | | | |
|---|---|---|---|---|
| 4,219,152 A | * | 8/1980 | Couch et al. | 235/462.27 |
| 4,682,015 A | * | 7/1987 | Quan | 235/462.27 |
| 5,061,843 A | * | 10/1991 | Sato et al. | 235/462.27 |
| 5,168,148 A | * | 12/1992 | Giebel | 235/462.26 |
| 5,677,523 A | * | 10/1997 | Coleman | 235/462.26 X |
| 5,902,989 A | * | 5/1999 | Metlitsky et al. | 235/462.26 X |

FOREIGN PATENT DOCUMENTS

DE      36 01 083 A1 * 7/1987

* cited by examiner

Primary Examiner—Michael G. Lee
Assistant Examiner—Jared J. Fureman
(74) Attorney, Agent, or Firm—Bacon & Thomas, PLLC

(57) ABSTRACT

An instant synchronous automatic gain control apparatus for a barcode reading device includes a sensor unit, a current amplification unit, a first stage amplification unit, a buffer stage amplification unit, a signal pickup amplification unit, a second stage amplification unit, a third stage amplification unit, a signal output amplification unit, a signal isolation match unit, and a signal rectification unit. When the barcode reading device receives a weak signal, the apparatus will process the signal and gain control synchronously and transmits desired digital signals to a microprocessor (CPU) or decoder circuit for processing.

4 Claims, 1 Drawing Sheet

INSTANT SYNCHRONOUS AUTOMATIC GAIN CONTROL APPARATUS

BACKGROUND OF THE INVENTION

This invention relates to an instant synchronous automatic gain control apparatus and particularly an automatic gain control apparatus for barcode reading devices.

The design of automatic gain control (AGC) circuits used in conventional barcode reading devices mostly employs the feedback control gain type. When detecting that output signal power is not adequate, it uses a feedback method to amplify the gain of the preceding stage for boosting the following signal. This method uses average value to control gain value and does not have a synchronization problem. It is easier to control and especially suitable for the environments where maintaining signal amplitude variation proportion is desired. However if the requirements are to get frequency without influencing by the circuit and to get output signals with same level, the design set forth cannot meet all the needs. Because for reaching the condition of every output has the same phase, every signal has to make synchronous gain adjustment. Using the feedback approach to adjust amplification gain, when the gain is adjusted for a preceding stage based on the detected signal, the signal has already passed the amplifier. Hence the produced result of the changing gain affects only the next set of signals. If the average value is not used, it could happen that the next signal might be too strong and result in over saturation or signal distortion. As aforesaid AGC design cannot perform instant synchronous control for adjusting gain, it cannot rectify amplification gain for every signal individually. By taking the average value, it is not an instant synchronous amplification gain adjustment.

SUMMARY OF THE INVENTION

It is therefore an object of this invention to resolve aforesaid disadvantages by providing an instant synchronous automatic gain control apparatus that is capable of performing instant signal and gain control process synchronously when the signal received by the barcode reading device is weak.

The instant synchronous automatic gain control apparatus according to this invention includes a sensor unit, a current amplification unit, a first stage amplification unit, a buffer stage amplification unit, a signal pickup amplification unit, a second stage amplification unit, a third stage amplification unit, a signal output amplification unit, a signal isolation match unit, and a signal rectification unit. When the barcode reading device receives a weak signal, the apparatus of this invention may process the signal and gain control synchronously and transmits desired digital signals to a microprocessor (CPU) or decoder circuit for process.

BRIEF DESCRIPTION OF THE DRAWINGS

The invention, as well as its many advantages, may be further understood by the following detailed description and drawing, in which.

DESCRIPTION OF THE PREFERRED EMBODIMENT

Figure 1:
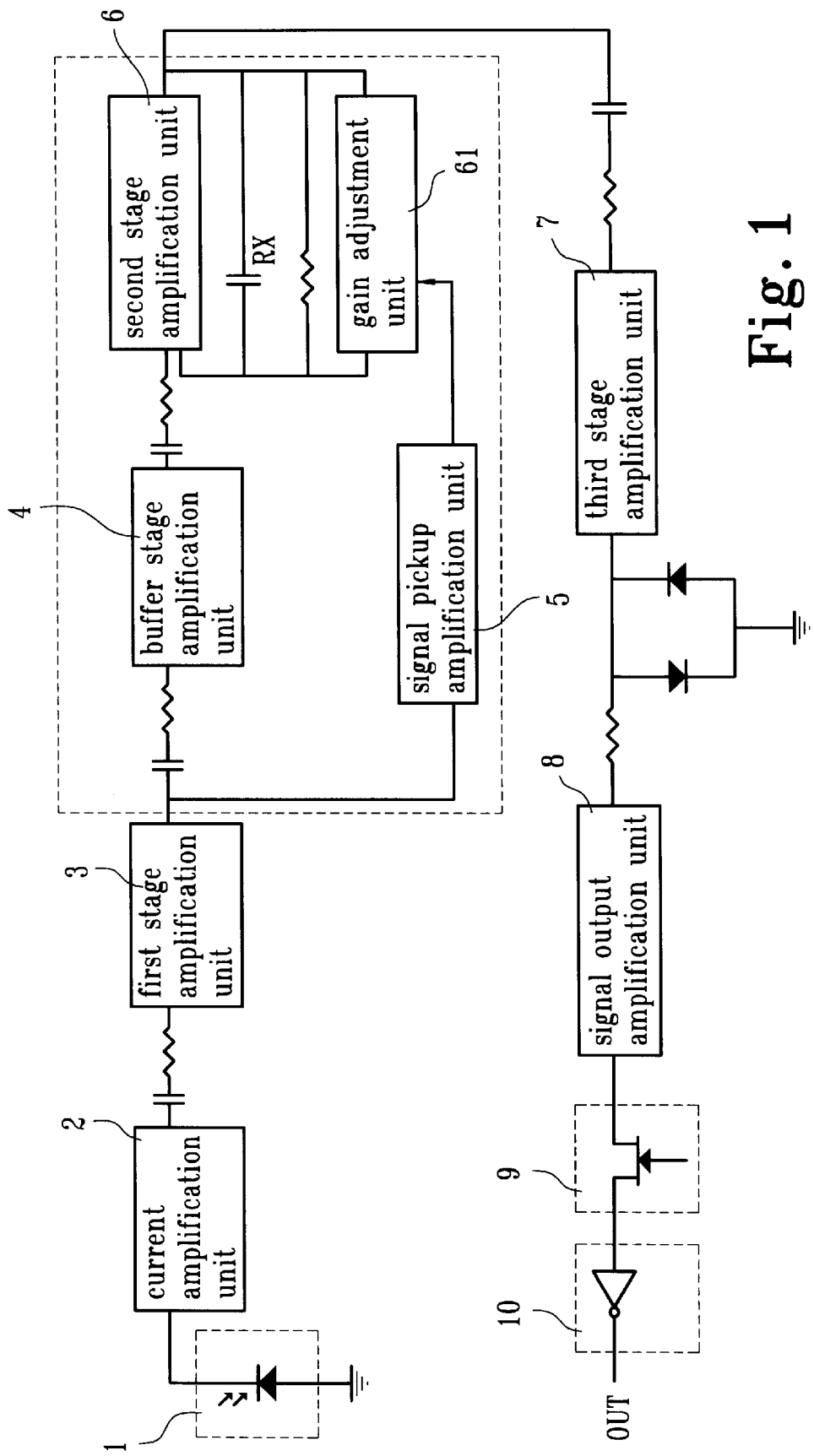
FIG. 1 is an electric circuit diagram of this invention.

Referring to FIG. 1, the apparatus of this invention aims at meeting the requirements of barcode reading devices. There are two prevailing methods of reading signals being adapted for barcode reading devices at present. One is CCD type which uses Charge Coupled Device (CCD) in which light is projected on the barcode and generates a reflection light of different intensity passing through a lens and directing to the CCD. The CCD transmits the signal to an amplification rectification circuit for process. Then the processed signal is transmitted to a decoder for decoding. Another one is laser type in which a scanning means scans a light spot on the barcode to form one or more scanning lines. Every light spot generates a reflection light which is picked up by a sensor element and transmitted to an amplification rectification circuit for processing. Regardless which method is used, there is always a problem of signals fading at two sides because of the problems relate to the incident angle and reflection angle of projection light and reflection light. In addition, because of the background light effect, it is more difficult to produce the results desired on the amplification circuit. Furthermore, when the object is located at a greater distance away, the receiving signal becomes weaker. Hence when the signal is within the pick up range, but the signal is fading due to factors such as distance, the automatic gain control becomes useful. However, when the signal intensity becomes not even resulting from the incident light angle and reflection light angle problem, the instant synchronous automatic gain control scheme of this invention is better than the feedback automatic gain control method.

In order to explain in details for the structure and function of the instant synchronous automatic gain control apparatus of this invention, the signal pickup process used for the laser type barcode scanner is given as an example below. The apparatus includes a sensor unit 1, a current amplification unit 2, a first stage amplification unit 3, a buffer stage amplification unit 4, a signal pickup amplification unit 5, a second stage amplification unit 6, a third stage amplification unit 7, a signal output amplification unit 8, a signal isolation match unit 9, and a signal rectification unit 10. The sensor unit 1 receives the reflecting barcode image light generated by projecting a light source from the barcode reading device to a barcode attached to an object. Then the received image light is processed to equip with desired electrical characteristics for output.

The current amplification unit 2 is used to amplify the signal output by the sensor unit 1.

The first stage amplification unit 3 amplifies the voltage of the signal output by the current amplification unit 2.

The buffer stage amplification unit 4 controls the signal and gain control for synchronous processing.

The signal pickup amplification unit 5 receives the amplified signal coming from the first stage amplification unit 3 to make output variation value match the variation curve of the gain adjustment element for reaching the desired AGC variation value needed for the product.

The second stage amplification unit 6 includes a gain adjustment unit 61 which has equivalent characteristics of a controllable resistance and may use resistance variation to adjust the amplified gain value of the second stage amplification unit 6, as a result to achieve the AGC function. The gain adjustment unit 61 may be, but not limit to, a Junction type Field Effect Transistor (J-FET), Unijunction Transistor (UJT), Compatible Duplex System (CDS), transistor, or the like.

The third stage amplification unit 7 amplifies the signal output by the second stage amplification unit 6 to reach desired level and amplitude suitable for the signal output amplification unit 8.

The signal output amplification unit 8 amplifies the signal output by the third stage amplification unit 7 to a desired digital signal level.

The signal isolation match unit 9 may be a J-FET for isolating the signal output amplification unit 8 and signal rectification unit 10 for preventing two loop signals from interfering with each other.

The signal rectification unit 10 may be, but not limited to, a rectification logic element such as an Inverter or Buffer for rectifying the digital signals amplified by aforesaid signal output amplification unit and to form waves with better high and low rim.

When this invention is in use, the sensor unit 1 senses the reflection light of the barcode image and output a signal. The signal is transmitted to the current amplification unit 2 for current amplification. The small signal output by the current amplification unit 2 goes to the first stage amplification unit 3 for voltage amplification to become stronger and more suitable for control signal use. Then the resulted signal goes to the signal pickup amplification unit 5 which makes variation of the output match with the variation curve of the gain adjustment unit 61 for getting the desired AGC variation value to meet product requirement. The gain adjustment unit 61 uses resistance variance to adjust the amplified gain value of the second stage amplification unit 6 for achieving the automatic gain control (AGC) function.

The buffer stage amplification unit 4 is disposed between the first stage amplification unit 3 and the second stage amplification unit 6. This is because every amplification unit will create delay. For attaining synchronization conditions for the signal and gain control, a buffer stage amplification unit 4 should be added for working with the signal pickup amplification unit 5. After going through automatic gain amplification of the second stage amplification unit 6, the amplified signal is output to the third stage amplification unit 7 for making the level and amplitude of the signal suitable for the output amplification unit 8. At this point, the signal output by the output amplification unit 8 has reached digital signal level. However because linear amplification unit and digital unit are two types of electronic loop which have different electrical characteristics, ideally, they should be independent from each other. Hence the signal isolation match unit 9 is disposed between the output amplification unit 8 and signal rectification unit 10 to prevent the two different loops from interfering with each other. Furthermore, ideal digital signal needs better high and low rim, therefore before the signal is being transmitted to the decoder, it will be sent to a logic element such as an inverter or buffer for rectification. Then the signal is transmitted to the CPU or decoder for process to obtain the desired scanning results.

It may thus be seen that the objects of the present invention set forth herein, as well as those made apparent from the foregoing description, are efficiently attained. While the preferred embodiment of the invention has been set forth for purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. An instant synchronous automatic gain control apparatus for a barcode reading device, comprising:
   a sensor unit for receiving reflected light from a barcode image resulting from projecting a light source on a barcode of an object by the barcode reading device and generating a first output signal;
   a current amplification unit for amplifying the first output signal and generating a second output signal;
   a first stage amplification unit for amplifying a voltage of the second output signal;
   a buffer stage amplification unit to control signal and gain control for synchronous processing,
   a signal pickup amplification unit for receiving the amplified signal from the first stage amplification unit to make an output variation value thereof matching a variation curve of a gain adjustment unit for achieving desired automatic gain control;
   a second stage amplification unit including the gain adjustment unit which has equivalent characteristics of a controllable resistance and uses resistance variance to adjust the amplified gain value of the second stage amplification unit for achieving desired automatic gain control;
   a third stage amplification unit for amplifying a signal output by the second stage amplification unit for getting a desired level and amplitude and output a third signal;
   a signal output amplification unit for amplifying the third signal to a desired digital signal level;
   a signal rectification unit for rectifying the digital signals amplified by the signal output amplification unit to have better up and low rim wave forms for transmitting to a microprocessor or decoder to process; and
   a signal isolation match unit for isolating the signal output amplification unit and signal rectification unit for preventing the signals of the two loops of the match unit and rectification unit thereof from interfering with each other.

2. The instant synchronous automatic gain control apparatus of claim 1, wherein the gain adjustment unit is selected from the group consisting of a Junction type Field Effect Transistor (J-FET), Unijunction Transistor (UJT), Compatible Duplex System (CDS), or transistor.

3. The instant synchronous automatic gain control apparatus of claim 1, wherein the signal isolation match unit is a Junction type Field Effect Transistor (J-FET).

4. The instant synchronous automatic gain control apparatus of claim 1, wherein the signal rectification unit is a logic unit of an inverter or buffer.

* * * * *